(12) United States Patent
Boehm

(10) Patent No.: US 10,437,557 B2
(45) Date of Patent: Oct. 8, 2019

(54) DETERMINATION OF A MATCH BETWEEN DATA VALUES STORED BY SEVERAL ARRAYS

(71) Applicant: Micron Technology, Inc., Boise, ID (US)

(72) Inventor: Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 15/885,316

(22) Filed: Jan. 31, 2018

(65) Prior Publication Data

US 2019/0235836 A1     Aug. 1, 2019

(51) Int. Cl.
| | | |
|---|---|---|
| G11C 7/10 | (2006.01) | |
| G06F 7/20 | (2006.01) | |
| G06F 1/30 | (2006.01) | |
| H03K 19/173 | (2006.01) | |
| G06F 3/06 | (2006.01) | |

(52) U.S. Cl.
CPC .................. *G06F 7/20* (2013.01); *G06F 1/30* (2013.01); *G06F 3/0617* (2013.01); *G06F 3/0688* (2013.01); *H03K 19/1733* (2013.01)

(58) Field of Classification Search
CPC ....................................................... G11C 15/00
USPC ....................................................... 365/49.17
See application file for complete search history.

(56) References Cited

U.S. PATENT DOCUMENTS 4,380,046 A     4/1983 Fung
4,435,792 A     3/1984 Bechtolsheim
4,435,793 A     3/1984 Ochii
(Continued)

FOREIGN PATENT DOCUMENTS

CN      102141905       8/2011
EP      0214718         3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Min Huang
(74) *Attorney, Agent, or Firm* — Brooks, Cameron & Huebsch, PLLC

(57) ABSTRACT

Apparatuses, systems, and methods related to determination of a match between data values stored by several arrays are described. A system using the data values may manage performance of functions, including automated functions critical for prevention of damage to a product, personnel safety, and/or reliable operation, based on whether the data values match. For instance, one apparatus described herein includes a plurality of arrays of memory cells formed on a single memory chip. The apparatus further includes comparator circuitry configured to compare data values stored by two arrays selected from the plurality to determine whether there is a match between the data values stored by the two arrays. The apparatus further includes an output component configured to output data values of one of the two arrays responsive to determination of the match between the data values stored by the two arrays.

10 Claims, 5 Drawing Sheets

(56) References Cited

U.S. PATENT DOCUMENTS

| | | |
|---|---|---|
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,432,729 A * | 7/1995 | Carson ............... H01L 25/0657 257/673 |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,491,665 A * | 2/1996 | Sachdev ............... G11C 29/34 365/189.04 |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B2 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |

(56) References Cited

U.S. PATENT DOCUMENTS

| | | |
|---|---|---|
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,697,876 B1 | 7/2017 | Tiwari et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0105324 A1* | 6/2004 | Sakurai ............... G11C 16/225 |
| | | 365/200 |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0239920 A1* | 9/2012 | Yang ..................... G06F 8/65 |
| | | 713/2 |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0007500 A1* | 1/2013 | Fiedler ................. G06F 1/10 |
| | | 713/501 |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0126302 A1 | 5/2014 | Yoon et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0106561 A1* | 4/2015 | Ware ..................... G11C 7/10 |
| | | 711/106 |
| 2015/0120987 A1 | 4/2015 | Wheeler |
| 2015/0121132 A1 | 4/2015 | Tian et al. |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0180948 A1* | 6/2016 | Tanabe ............... G11C 16/0475 |
| | | 365/185.21 |
| 2016/0188250 A1 | 6/2016 | Wheeler |
| 2016/0196142 A1 | 7/2016 | Wheeler et al. |
| 2016/0196856 A1 | 7/2016 | Tiwari et al. |

(56) References Cited

U.S. PATENT DOCUMENTS

| | | |
|---|---|---|
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0300625 A1 | 10/2016 | Kim |
| 2016/0306584 A1 | 10/2016 | Zawodny et al. |
| 2016/0306614 A1 | 10/2016 | Leidel et al. |
| 2016/0350230 A1 | 12/2016 | Murphy |
| 2016/0365129 A1 | 12/2016 | Willcock |
| 2016/0371033 A1 | 12/2016 | La Fratta et al. |
| 2017/0024127 A1 | 1/2017 | Bazarsky et al. |
| 2017/0052906 A1 | 2/2017 | Lea |
| 2017/0162243 A1 | 6/2017 | Manning |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |
| 2017/0371539 A1 | 12/2017 | Mai et al. |
| 2018/0012636 A1 | 1/2018 | Alzheimer et al. |
| 2018/0024769 A1 | 1/2018 | Howe et al. |
| 2018/0024926 A1 | 1/2018 | Penney et al. |
| 2018/0025759 A1 | 1/2018 | Penney et al. |
| 2018/0025768 A1 | 1/2018 | Hush |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed April 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7 Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2019/013613, dated Apr. 19, 2019, 13 pages.

* cited by examiner

COMPARATOR COMPONENT

DETERMINATION OF A MATCH BETWEEN DATA VALUES STORED BY SEVERAL ARRAYS

TECHNICAL FIELD

The present disclosure relates generally to semiconductor memory and methods, and more particularly, to apparatuses, systems, and methods for determination of a match between data values stored by several arrays.

BACKGROUND

Memory devices are typically provided as internal, semiconductor, integrated circuits in computers or other electronic systems. There are many different types of memory, including volatile and non-volatile memory. Volatile memory can require power to maintain its data (e.g., host data, error data, etc.). Volatile memory can include random access memory (RAM), dynamic random access memory (DRAM), static random access memory (SRAM), synchronous dynamic random access memory (SDRAM), and thyristor random access memory (TRAM), among other types. Non-volatile memory can provide persistent data by retaining stored data when not powered. Non-volatile memory can include NAND flash memory, NOR flash memory, and resistance variable memory, such as phase change random access memory (PCRAM) and resistive random access memory (RRAM), and magnetoresistive random access memory (MRAM), such as spin torque transfer random access memory (STT RAM), among other types.

Electronic systems often include a number of processing resources (e.g., one or more processors), which may retrieve instructions from a suitable location and execute the instructions and/or store results of the executed instructions to a suitable location (e.g., the volatile and/or non-volatile memory). A processor can include a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., NOT) logical operations on data (e.g., one or more operands). For example, functional unit circuitry may be used to perform arithmetic operations such as addition, subtraction, multiplication, and division on operands via a number of operations.

In many instances, the processing resources may be external to the memory device (e.g., including a number of memory arrays) and the data may be accessed via a bus between the processing resources and a memory array to execute a set of instructions. However, one or more errors in storage and/or accessing of data values in the instructions and movement of such data values from the bank to a processor external to the memory device may influence whether the instructions may be executed as intended for performance of an operation by an external processing resource.

DETAILED DESCRIPTION

Figure 1A:
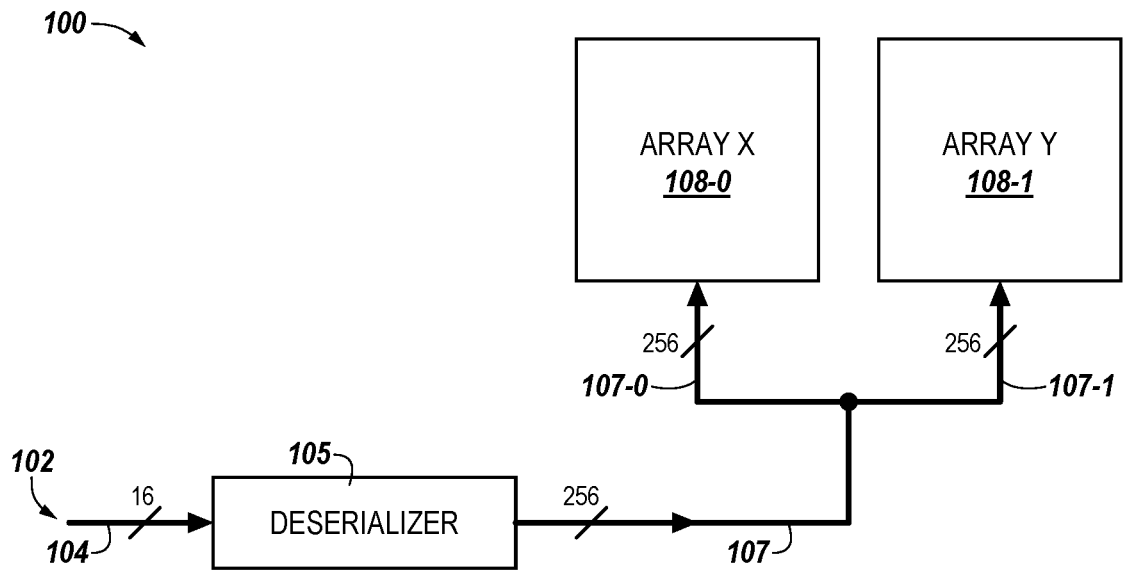
FIGS. 1A and 1B are schematic diagrams illustrating examples of storing a single data file on at least two arrays of memory cells in accordance with a number of embodiments of the present disclosure.

The present disclosure includes systems, apparatuses and methods associated with determination of a match between data values stored by two arrays. In a number of embodiments, an apparatus includes a plurality of arrays of memory cells formed on a single memory chip. The apparatus further includes comparator circuitry configured to compare data values stored by two arrays selected from the plurality to determine whether there is a match between the data values stored by the two arrays. The apparatus further includes an output component of the comparator circuitry configured to output data values of one of the two arrays responsive to determination of the match between the data values stored by the two arrays.

Being formed on a single memory chip (e.g., on chip) is intended herein to mean being formed (e.g., positioned) on a same chip as a memory array (e.g., as shown at 108 and described in connection with FIGS. 1A and 1B and elsewhere herein). "Memory array" as used herein is a general term intended to include bank groups 213, banks 214, and/or bank sections 216 shown in and described in connection with FIG. 2 (e.g., in a DRAM configuration, although memory arrays are not limited to being in the DRAM configuration). In a number of embodiments, the bank sections 216 may correspond to "subarrays" of a DRAM memory array and/or bank.

In contrast, being formed on a different chip (e.g., off chip) is intended herein to mean being formed (e.g., positioned) on a chip associated with execution of instructions (e.g., coded in a sequence of data values) received (e.g., sent) from on chip for performance of an operation by an external processing resource (e.g., a functionality as shown at 338 and described in connection with FIG. 3 and elsewhere herein). A monitor (e.g., as shown at 339 and described in connection with FIG. 3 and elsewhere herein) also may be formed off chip (e.g., coupled to at least one functionality 338) to receive a notification of a determination of no match between the data values for the instructions stored by the two arrays.

Performance of functions based upon execution of sequences of data values (instructions) stored by and accessed from memory arrays may be an integral part of many automated systems. A system using the data values may manage performance of functions, including automated functions critical for prevention of damage to a product, personnel safety, and/or reliable operation, based on whether the data values match. Proper performance of the functions contributing to the automated systems may be critical for prevention of damage to a product including such automated systems (e.g., autonomous vehicles, such as automobiles, trains, airplanes, rockets, space stations, etc., among many other possibilities) and/or safety of a person (e.g., a passenger of an autonomous vehicle, a bicyclist, a pedestrian, an observer, etc., among many other possibilities) using and/or near such automated systems.

Hence, automated systems utilized in such implementations may benefit from lower error rates in stored data values to be executed for performance of the functions contributing to the automated systems (e.g., relative to error rates considered acceptable for other utilities, such as cellular telephones, smart phones, personal computers, etc.). Accordingly, the determination of a match between the data values (instructions) redundantly stored by the two arrays and/or the notification of no such match described herein may enhance prevention of damage to products including such automated systems and/or safety of persons using and/or near such automated systems.

The figures herein follow a numbering convention in which the first digit or digits of a reference number correspond to the figure number and the remaining digits identify an element or component in the figure. Similar elements or components between different figures may be identified by the use of similar digits. For example, 108 may reference element "08" in FIG. 1A, and a similar element may be referenced as 308 in FIG. 3.

Figure 1B:
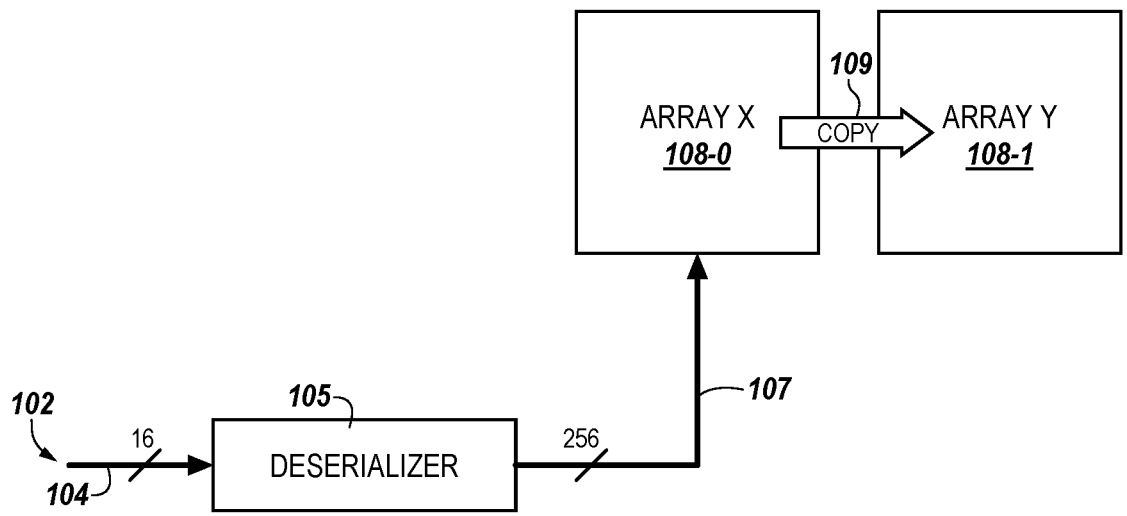

FIGS. 1A and 1B are schematic diagrams 100 illustrating examples of redundantly storing a single data file on at least two arrays in accordance with a number of embodiments of the present disclosure. Two arrays of memory cells are represented by array X at 108-0 and array Y at 108-1, although in a number of embodiment a single data file 102 may be stored in more than two arrays and two arrays may be selected therefrom for comparison of the data values, as described herein. The single data set or file 102 may be, or may include, a number of data values encoded as instructions to be executed for performance of an operation (e.g., braking, accelerating, turning, etc., for controlling progress of an autonomous vehicle toward arrival at an intended destination, among many other possibilities). The single data file 102 referred to herein may also, or alternatively, be referred to as data, a data set, or the like. Data also may include control information or executable instructions, in various contexts.

The single data file 102 may be received from, for example, a host (not shown), using a k-bit data bus 104, where k may represent a number of data values (bits) in the single data file 102 to be received at a time (e.g., in one cycle of a computer). In a number of embodiments, the number of data values received by the k-bit data bus 104 may be 16, as in the example shown in FIGS. 1A and 1B, although embodiments are not limited to a 16 bit data bus.

The k bits of data may be deserialized into a number (n) of portions using a deserializer 105 coupled to the k-bit data bus. The n portions of the k bits of data may be moved (e.g., electronically transported) via a kn-bit data bus 107 to at least one of the two arrays (e.g., to array 108-0 and/or array 108-1). In a number of embodiments, the number of data values moved via the kn-bit data bus 107 may be 256 (=16×16), as in the example shown in FIGS. 1A and 1B, although embodiments are not limited to a 256 bit data bus. The n portions of the k bits of data may be redundantly stored on the two arrays as the single data file 102.

As shown in FIG. 1A, in some embodiments, the single data file 102 may be redundantly stored in parallel on the two arrays via two sets of data lines (e.g., kn-bit data buses 107-0 and 107-1) separately coupled to the two separate arrays (e.g., array 108-0 and array 108-1, respectively). The kn-bit data buses 107-0 and 107-1 each may be a number of physical data lines that move the redundant single data file (e.g., duplicate data values) to each of the two separate arrays 108-0 and 108-1.

As shown in FIG. 1B, in some embodiments, the single data file 102 may be stored on a first array (e.g., array 108-0) of the two arrays via a set of data lines 107 coupled to the first array. A copy function 109 may be performed on the single data file stored on the first array 108-0 to redundantly store the single data file 102 on a second array 108-1.

Figure 2:
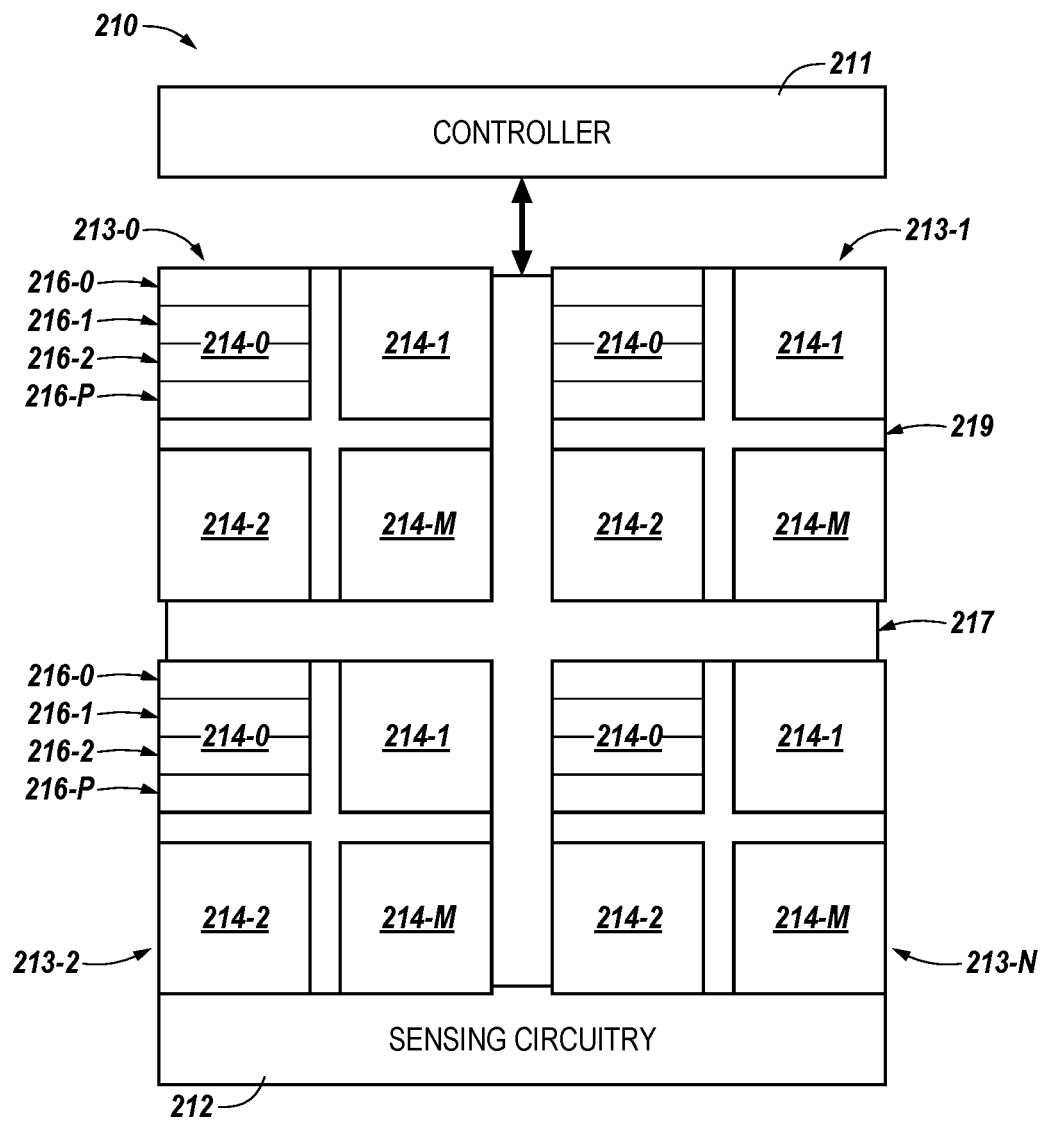
FIG. 2 is a block diagram of examples of arrays of memory cells on a portion of a memory device in accordance with a number of embodiments of the present disclosure.

FIG. 2 is a block diagram of examples of arrays of memory cells on a portion of a memory device 210 in accordance with a number of embodiments of the present disclosure. As described herein, a plurality of arrays of memory cells may be formed on a single memory chip. The portion of the memory device 210 shown in FIG. 2 may be formed (e.g., included) on the single memory chip (e.g., may be on chip). Being on chip also is intended, in a number of embodiments, to mean being formed on the same chip as a controller 211 and/or sensing circuitry 212 coupled to the plurality of arrays.

The controller 211 (e.g., bank control logic and sequencer) may include control circuitry, in the form of hardware, firmware, or software, or combinations thereof. As an example, the controller 211 may include a state machine, a sequencer, and/or some other types of control circuitry, which may be implemented in the form of an application specific integrated circuit (ASIC) coupled to a printed circuit board. In a number of embodiments, the controller 211 may be co-located with the host (not shown) (e.g., in a system-on-chip (SOC) configuration).

The host and/or a dedicated component may include a number of processing resources (e.g., one or more processors, microprocessors, or some other type of controlling circuitry) external to the chip (off chip) on which the memory device 210 is formed. The external processing resources may be capable of accessing the memory device 210 (e.g., via controller 211) to perform operations on data values moved from the memory device 210. At least some of the operations may be performed by various functionalities (e.g., the functionality as shown at 338 and described in connection with FIG. 3 and elsewhere herein) associated with the host and/or the dedicated component. Controller 211 also may, in a number of embodiments, include a number of processing resources for performance of processing operations. The controller 211 may perform address resolution for an entire block of instructions (e.g., commands associated with executing instructions encoded in a single data file) and data and direct (e.g., control) allocation and storage of data and commands into allocated locations in the arrays (e.g., bank groups 213, banks 214, and/or bank sections 216) and/or to an external destination.

The sensing circuitry 212 may be configured to sense data values stored by the arrays (e.g., by being selectably coupled to a particular row of memory cells in an array). The sensed data values may be made accessible to comparator circuitry (e.g., as shown at 332 and described in connection with FIG. 3 and elsewhere herein) configured to compare data values of the single date file 102 stored by the two arrays to determine whether there is a match between the data values stored by the two arrays. The match may be between the data values of the single data file 102 stored by two arrays in which the data values are redundantly stored.

The controller 211 may be configured to receive a request (e.g., from the host and/or the functionality 338) for the stored single date file 102. The controller 211 may, in a number of embodiments, be configured to direct the comparator circuitry 332 to access the data values stored by the at least two arrays to determine whether there is a match between the two arrays.

Being on chip also may, in a number of embodiments, be intended to mean being formed on the same chip as the comparator circuitry 332, which may include the output component (e.g., as shown at 333 and described in connection with FIG. 3 and elsewhere herein). Being on chip also may, in a number of embodiments, be intended to mean being formed on the same chip as the deserializer 105 and/or a serializer (e.g., as shown at 334 and described in connection with FIG. 3 and elsewhere herein), along with associated data lines (e.g., buses 104 and 107).

The plurality of arrays 108 formed on chip with the memory device 210 and on which the single data file 102 is redundantly stored by, in a number of embodiments, at least two arrays may be variously implemented. In a number of embodiments, two arrays on which the single data file 102 is redundantly stored may each correspond to a different bank group formed on chip (e.g., bank groups 213-0, 213-1, 213-2 and 213-N, although the number of different bank groups is not limited to four). Each different bank group may have a plurality of memory banks formed on chip (e.g., banks 214-0, 214-1, 214-2 and 214-M, although the number of banks is not limited to four). In a number of embodiments, the two arrays may each correspond to a different bank formed on chip. The different banks may be selected from banks 214-0, 214-1, 214-2 and 214-M. In a number of embodiments, the two arrays may each correspond to a different section (e.g., sections 216-0, 216-1, 216-2 and 216-P, although the number of sections is not limited to four) of a single bank (e.g., bank 214-0, among other possible banks) formed on chip.

In various embodiments, any two of the plurality of bank groups 213-0, . . . , 213-N, of the plurality of banks 214-0, . . . , 214-M, and/or the plurality of sections 216-0, . . . , 216-P at various positions on chip may be selected for redundant storage of the single data file 102 and/or for comparison of the data values stored thereon for determination of a possible match. Determination of the arrays on which to store the single data file 102 may be influenced by the size (e.g., number of data values) of the single data file, among other possible considerations. By way of example, two out of four of the bank groups 213 shown in FIG. 2 may be selected, two out of four banks 214 in bank group 213-0 may be selected or one bank in each of two different bank groups may be selected, and/or two out of four sections 216 in bank 214-0 may be selected or one section in each of three different banks may be selected, among other possible selections of the two arrays.

In a number of embodiments, the two arrays selected from the plurality for redundant storage of the single date file 102 may each be formed on chip in a DRAM configuration. Implementations of the circuitry described herein may be utilized for determination of a match between data values stored, for example, by two arrays in the DRAM configuration conforming to protocols such as those promulgated by JEDEC, including DDR3, DDR4, etc.

Depending upon the architecture of the memory device 210 and/or the arrays 213, 214, 216 on chip, the arrays upon which the single data file 102 is redundantly stored may not be physically close (e.g., adjacent and/or contiguous) to each other. For example, accounting for routing and/or die size considerations, the arrays 213, 214, 216 may be physically separated from each other (e.g., via channels 217 and/or 219)

Figure 3:
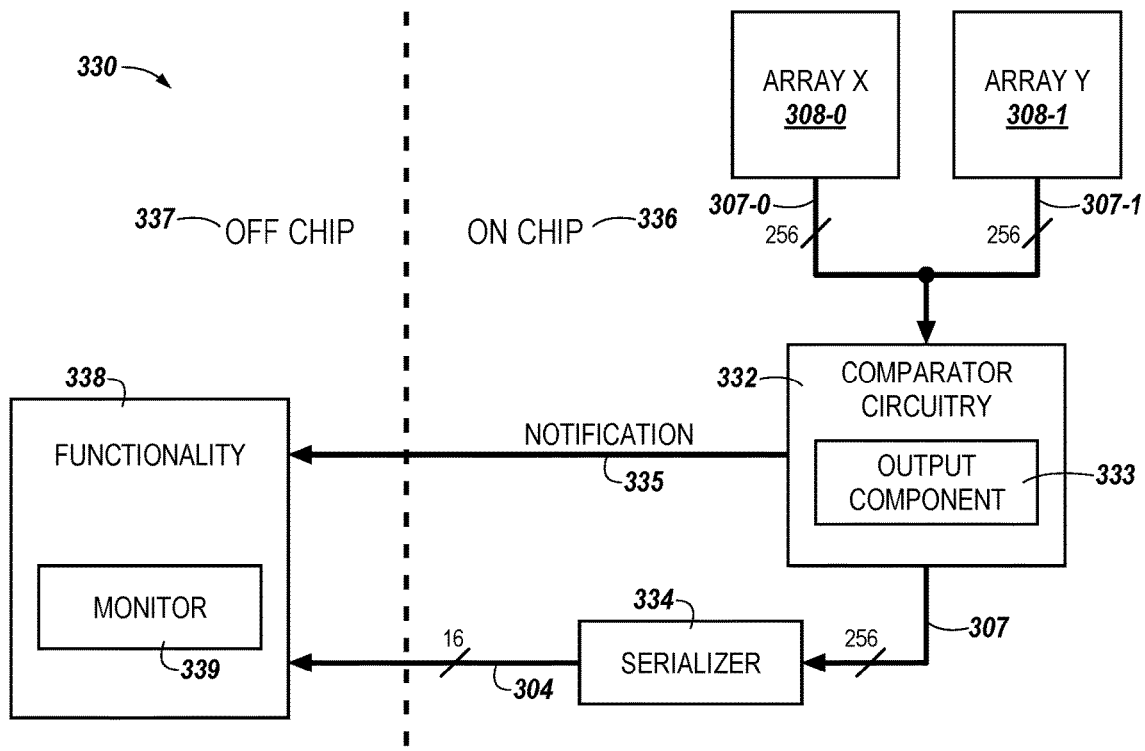
FIG. 3 is a schematic diagram illustrating an example of circuitry for comparing data values stored by two arrays in accordance with a number of embodiments of the present disclosure.

FIG. 3 is a schematic diagram illustrating an example of circuitry for comparing data values stored by two arrays in accordance with a number of embodiments of the present disclosure. As described herein, a plurality of arrays of memory cells may be formed on chip 336 and a single data file 102 may, in some embodiments, be redundantly stored by each of two arrays (e.g., array X at 308-0 and array Y at 308-1) of the plurality of arrays. The plurality of arrays, including the two arrays 308-0 and 308-1, may, in a number of embodiments, each be formed in a same configuration of memory cells on chip 336. The same configuration may facilitate comparison and matching by the comparator circuitry 332 of the redundantly stored data values accessed from the two arrays 308-0 and 308-1 via respective data lines (e.g., kn-bit data buses) 307-0 and 307-1.

For example, each of the plurality of arrays (e.g., as shown at 213, 214, and/or 216 and described in connection with FIG. 2) may be configured as DRAM circuitry in which each of the bank groups 213 may include the same number of banks 214 and each of the banks 214 may include the same number of sections 216 (e.g., subarrays). Each bank 214 and/or section 216 may include the same number of rows of memory cells. Each row may include the same number of memory cells, by which each bank 214 and/or section 216 may include the same number of columns of memory cells. The memory cells in the DRAM configuration may each be formed as a one access device (e.g., transistor) and one storage element (e.g., capacitor) 1T1C memory cell that each may be coupled to a sense amplifier (not shown) in the sensing circuitry 212. However, embodiments are not so limited, such that some embodiments may have memory cells in a 2T2C DRAM configuration (e.g., in which each memory cell may be coupled to the sense amplifier and/or a compute component (not shown) in the sensing circuitry 212) or in other configurations (e.g., a 3T configuration, among other possible configurations).

Comparator circuitry 332 may be configured to compare data values stored by the two arrays 308-0 and 308-1 selected from the plurality of arrays to determine whether there is a match between the data values stored by the two arrays. As described herein, a single date file 102 may be redundantly stored by each of the two arrays and the comparator circuitry 332 may be configured to compare data values of the single date file stored by the two arrays. The comparator circuitry 332 may be formed (e.g., positioned) on chip 336 with the plurality of arrays. The comparator circuitry 332 may be positioned in various locations on chip 336 (e.g., accounting for routing and/or timing considerations).

The comparator circuitry 332 may be further configured to determine whether there is the match between the data values based upon an adjustable threshold number of mismatches and/or positions of such mismatches of data values in the single date file 102 stored by the two arrays. In a number of embodiments, the adjustable threshold number of mismatches may be 0-10 mismatches, which may be adjusted based upon a number of parameters (e.g., the number of data values in the single date file 102). The adjustable threshold number may be adjusted to no mismatches (0 mismatches). For example, 0 mismatches may be selected as the threshold number when proper performance of an operation enabled and/or controlled by a functionality 338 may affect safety of passengers and/or bystanders (e.g., braking and/or evasive maneuvers of an autonomous automobile to avoid collision with another automobile and/or pedestrian, among many other possible operations). Accordingly, the plurality of arrays of memory cells and/or the comparator circuitry 332 formed on chip 336 may be formed (e.g., located) on an autonomous vehicle, among various other possible locations and/or implementations.

An output component 333 of the comparator circuitry 332 may be configured to output data values of one of the two arrays (e.g., from either array 308-0 or array 308-1) responsive to determination of the match between the data values stored by the two arrays. For example, the data values may be outputted by the output component 333 from a selected (e.g., default) one of the two arrays when there is a match determined by the comparator circuitry 332 between the data values of the single date file 102 stored by array 308-0 and array 308-1.

The output component 333 may be further configured to send the data values from the one array to a serializer 334 formed on chip 336 for output to a functionality 338 formed off chip 337. The serializer 334 may be configured to reconstruct the n portions of the single data file 102, moved via a data bus (e.g., a kn-bit data bus) 307 from one of the two arrays 308-0, 308-1 to the serializer 334, into a single sequence of data values (bits). The single sequence of data values of the single data file 102 may be sent via a data bus (e.g., a k-bit data bus) 304 from the serializer 334 to the functionality 338. The functionality 338 shown in FIG. 3 may be one of a plurality of off chip functionalities that enable and/or control various operations (e.g., each functionality may enable and/or control performance of a single operation and/or set of operations that is different from those enabled and/or controlled by another functionality). An identification (e.g., by controller 211) of which particular single data file is being requested (e.g., by a host and/or a functionality), may enable determination of a particular off chip functionality to which the single sequence of data values of the single data file 102 is to be sent.

A notification 335 of no match may, in a number of embodiments, be sent responsive to no match being determined, by the comparator circuitry 332, by comparison of the data values of the single date file 102 stored by array 308-0 and array 308-1. The notification 335 may be sent to a monitor component 339 coupled to and/or part of the functionality 338. Receipt of such a notification 335 may indicate to the monitor component 339 that the sequences of data values (instructions) stored by the two arrays may be relied upon to be without data errors and that the function intended to be performed by the functionality 338 is to be disabled (e.g., due to unintended results potentially occurring from execution of erroneous instructions). Responsive to determination and notification 335 of no match, or a mismatch, between the data values stored by the at least two arrays of the three arrays, the monitor component 339 may enable execution of instructions for a failover functionality (not shown) (e.g., a designated functionality with instructions stored in memory off chip 337). In a number of embodiments, the failover functionality may be executed to perform an alternative function in place of the disabled function (e.g., pulling over and parking an autonomous automobile in an available parking space, among many other possibilities).

In a number of embodiments, a notification 335 also may be sent responsive to determination, by the comparator circuitry 332, of a match between the data values redundantly stored by arrays 308-0 and 308-1. The notification 335 confirming determination of the match may be sent to the functionality 338, the monitor component 339, and/or to the host.

Notification 335 of no match being determined by comparison of the data values of the single date file 102 stored by the arrays 308-0 and 308-1 may be provided by a particular signal (e.g., a data value of 0). In contrast, notification 335 of a match being determined by comparison of the data values stored by the arrays 308-0 and 308-2 may be provided by a different signal (e.g., a data value of 1).

The notification 335 of no match or a match may, in a number of embodiments, be sent off chip 337 directly to the functionality 338, the monitor component 339, and/or to the host via a dedicated data line and/or pin, as indicated in FIG. 3. In a number of embodiments (e.g., where there may not be the dedicated data line and/or pin) the notification 335 may be sent via the serializer 334 and/or a first in/first out (FIFO) queue (not shown). In a number of embodiments, the FIFO queue may be utilized in determination of an order of output from the serializer 334. The notification 335 may, in a number of embodiments, be sent directly, or via the serializer 334 and/or the FIFO queue, off chip 337 to the failover functionality to quickly enable execution of instructions for the alternative function. The notification 335 may be sent as the signal (e.g., either data value 0 or 1) being included at a particular position (e.g., at a last unit interval) of a data burst outputted by the serializer 334 and/or the FIFO queue. Alternatively or in addition, the notification 335 may be sent to the controller 211 on chip 336 for determination of whether to send the notification 335 off chip 337 to the functionality 338, the monitor component 339, the failover functionality, and/or to the host for determination of the alternative function.

In a number of embodiments, responsive to determination by the comparator circuitry 332 of a match, then portions of the single data file 102 may be sent on chip 336 from the comparator circuitry 332 to the serializer 334. The single sequence of data values of the single data file 102 reconstructed by the serializer 334 may be sent from the serializer 334 off chip 337 to the functionality 338 without a notification 335 being sent to the monitor component 339. In contrast, responsive to determination by the comparator circuitry 332 of no match, the notification 335 may be sent off chip 337 to the monitor component 339.

In a number of embodiments, the monitor component 339 may be configured to decide whether and/or what function to enable in response to input of the notification 335 (e.g., when the notification is of no match being determined by the comparator circuitry 332). The monitor component 339 also may be configured for input of a number of signals and/or data from a number of other components and/or systems (e.g., of an autonomous vehicle) to contribute to making the decision whether and/or what function to enable. The monitor component 339 also may be configured to continuously enable the failover functionality and/or performance of the alternative function (e.g., until a determination of a match between two arrays for the requested single data file, or until supply of electrical power to the memory device 210 has been resumed following an interruption, among other possibilities).

Figure 4:
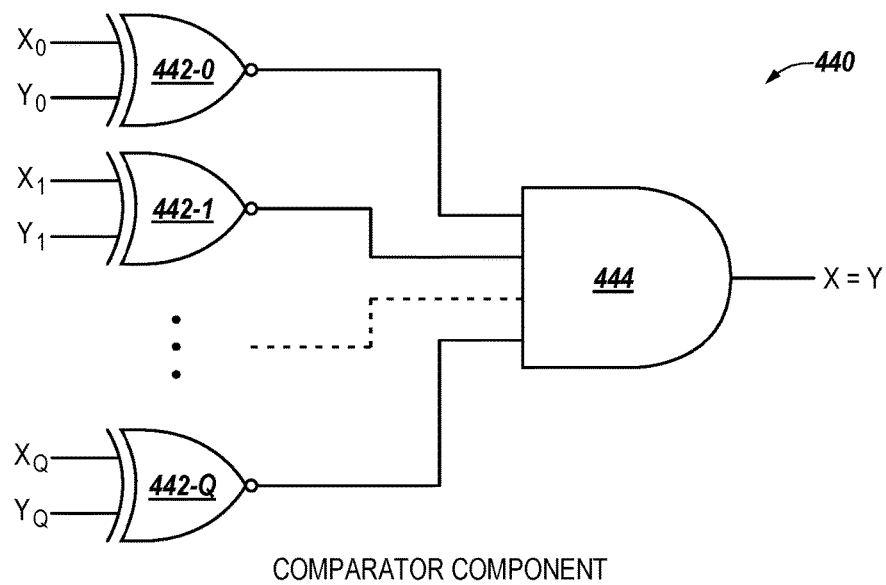
FIG. 4 is a schematic diagram illustrating an example of comparator component circuitry in accordance with a number of embodiments of the present disclosure.

FIG. 4 is a schematic diagram illustrating an example of a comparator component 440 in accordance with a number of embodiments of the present disclosure. The comparator component 440 illustrated in FIG. 4 may be coupled to, or part of, the comparator circuitry shown at 332 and described in connection with FIG. 3 and elsewhere herein.

In a number of embodiments that have two arrays selected from the plurality of arrays for redundant storage of a single data file 102, there may be one comparator component 440 of the comparator circuitry 332 corresponding to the two arrays. For example, when the number of arrays is two arrays (e.g., arrays 308-0 and 308-1) selected from the plurality there may be one comparator component 440 corresponding to the pairing of the two arrays. The comparator component 440 may be configured to compare two paired data values (e.g., data values $x_0$ and $y_0$, $x_1$ and $y_1, \ldots, x_Q$ and $y_Q$) via a logic gate (e.g., logic gates 442-0, 442-1, ..., 442-Q) corresponding to each paired data value stored by the two arrays (e.g., array X and array Y).

In a number of embodiments, an n-bit comparator component 440 may compare all kn paired data values (bits) redundantly stored in the two arrays (e.g., accessed via kn-bit data buses 107-0 and 107-1 from array X and array Y). For example, all the paired data values $x_0$ and $y_0$, $x_1$ and $y_1, \ldots, x_Q$ and $y_Q$ for the single data file 102 redundantly stored in arrays X and Y may be analyzed using the corresponding logic gates 442-0, 442-1, ..., 442-Q to determine whether there is a match between each of the paired data values. Each of the logic gates 442 may be, or may include, an XNOR logic gate, as shown in FIG. 4, although embodiments are not limited to the XNOR logic gate. The XNOR logic gate may output a particular signal (e.g., a data value of 1) when particular paired data values accessed from the two arrays match and may output a different signal (e.g., a data value of 0) when different paired data values accessed from the two arrays do not match.

A differential indicator determined by the three comparator component 440 may be utilized to indicate whether comparison of the data values for the pairing indicates a match for the pairing of the two arrays. For example, a particular differential indicator signal (e.g., a data value of 1) may be output by logic gate 444 when all of the paired data values from array X and array Y match (X=Y), as determined by output of matching signals (e.g., all data values of 1) from the plurality of logic gates 442. In contrast, a different differential indicator signal (e.g., a data value of 0) may be output by logic gate 444 when all of the paired data values from array X and array Y do not match (X≠Y), as determined by output of non-matching signals (e.g., at least one data value of 0) from the plurality of logic gates 442. The logic gate 444 may be, or may include, an AND logic gate, as shown in FIG. 4, although embodiments are not limited to the AND logic gate.

Figure 5:
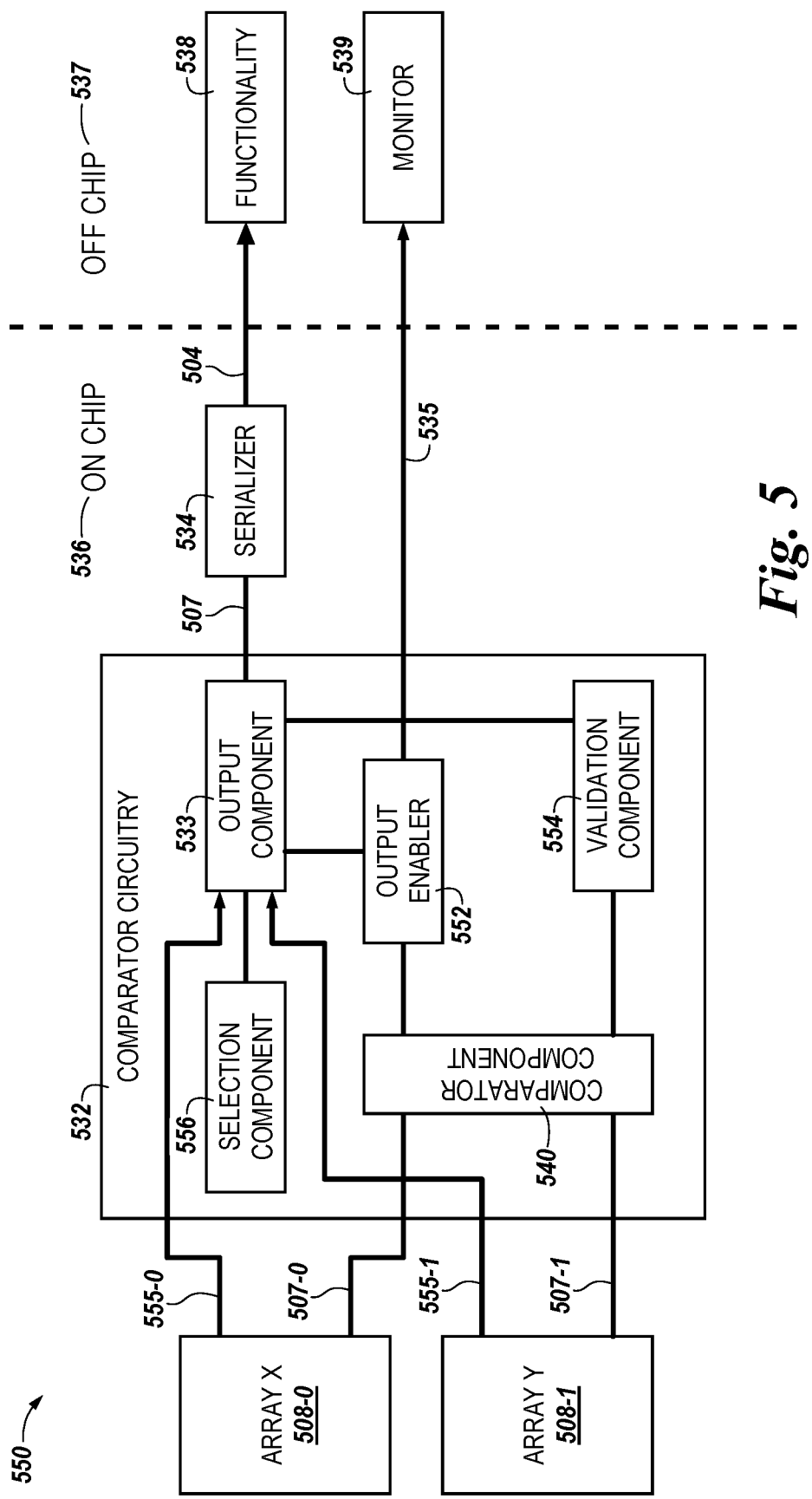
FIG. 5 is a block diagram illustrating an example of two arrays coupled to comparator circuitry in accordance with a number of embodiments of the present disclosure.

FIG. 5 is a block diagram illustrating an example 550 of two arrays coupled to comparator circuitry in accordance with a number of embodiments of the present disclosure. As illustrated in the example 550 shown in FIG. 5, two arrays (e.g., array X at 508-0 and array Y at 508), may, in a number of embodiments, be coupled (e.g., via two sets of data lines 507-0 and 507-1) on chip 536 to a respective comparator component 540 of the comparator circuitry 532. The arrays 508 each may be formed in one or more of the alternative embodiments shown at 213, 214, and 216 and described in connection with FIG. 2. The comparator component 540 may be formed as shown at 440 and operate as described in connection with FIG. 4 or the comparator component 540 may be formed in a different configuration (e.g., with different logic gates 442 and/or 444 or other differences in the configuration).

The comparator component 540 may, in a number of embodiments, be selectably coupled to an output enabler 552 of the comparator circuitry 532. An output component 533 of the comparator circuitry 532 may be configured to output data values of one of the two arrays in which the single data file 102 is redundantly stored responsive to determination of a match between the data values stored by the two arrays. The at least two arrays on which the single date file 102 may be redundantly stored may be accessible (e.g., by the controller 211 located on chip 536 and/or a functionality 538, a monitor component 539, and/or host formed off chip 537 via a single network socket and are not accessible via corresponding redundant network sockets for redundant memory.

The output enabler 552 may be configured to enable activation of the output component 533 responsive to determination by the output enabler 552 of a match between the data values stored by, in a number of embodiments, the two arrays in which the single data file 102 is redundantly stored. For example, when there is a match of the data values of the single data file 102 between at two arrays 508-0 and 508-1, as determined by the respective comparator component 540, the output enabler 552 may send an activation signal (e.g., a data value of 1) to the output component 533. The output enabler 552 may be further configured to enable output of a notification 535 (e.g., as shown at 335 and described in connection with FIG. 3) to the monitor component 539 formed off chip 537 responsive to determination by the output enabler 552 of no match between the data values stored by the two arrays.

For example, an enablement signal (e.g., a data value of 1) may be output by a logic gate of the output enabler 552 to enable activation of the output component 533 and/or to provide the notification 535. The logic gate of the output enabler 552 may be, or may include, an OR logic gate, although embodiments are not limited to the OR logic gate.

The activated output component 533 may be configured (e.g., as a multiplexer) to select between coupling of a first bus 555-0 to a first array (e.g., array X at 508-0) and coupling of a second bus 555-1 to a second array (e.g., array Y at 508-1) responsive to determination of the match between the data values stored by the two arrays. The data values accessed from the first array or the second array may be moved via a data bus 507 (e.g., kn-bit data bus shown at 307 and described in connection with FIG. 3) to a serializer 534. The serializer 534 may send the data values accessed from the first array or the second array as a single sequence of data values of the single data file 102 off chip 537 via a data bus 504 (e.g., k-bit data bus shown at 304 and described in connection with FIG. 3). Accordingly, the output component 533 may enable output of the data values corresponding to the match from the first array or the second array to the functionality 538 formed off chip 537.

A validation component 554 may be configured to direct that the data values of the valid match (e.g., either from array X or array Y) are output by the activated output component 533 (e.g., via selection and coupling of the first bus 555-0 to array X at 508-0 or via selection and coupling of the second bus 555-1 to array Y at 508-1). For example, a particular validation signal (e.g., a data value of 0) may be output by a logic gate of the validation component 554 to enable output of data values from array X at 507-0 via the activated output component 533. In contrast, a different validation signal (e.g., a data value of 1) may be output by the logic gate of the validation component 554 to enable output of data values from array Y at 507-1 via the activated output component 533. The logic gate of the validation component 554 may be, or may include, an AND logic gate. In a number of embodiments, the AND logic gate may have one input coupled to a NOT logic gate, although embodiments are not limited to the AND logic gate and/or the NOT logic gate.

A selection component 556 may be configured to enable direction of the output component 533 to select a first array (e.g., array X at 508-0) as a default option responsive to the determination of the match between the first array and the second array (e.g., array Y at 508-1) of the two arrays. In a number of embodiments, the default option may be either array X or array Y (e.g., accounting for routing and/or timing considerations).

Figure 6:
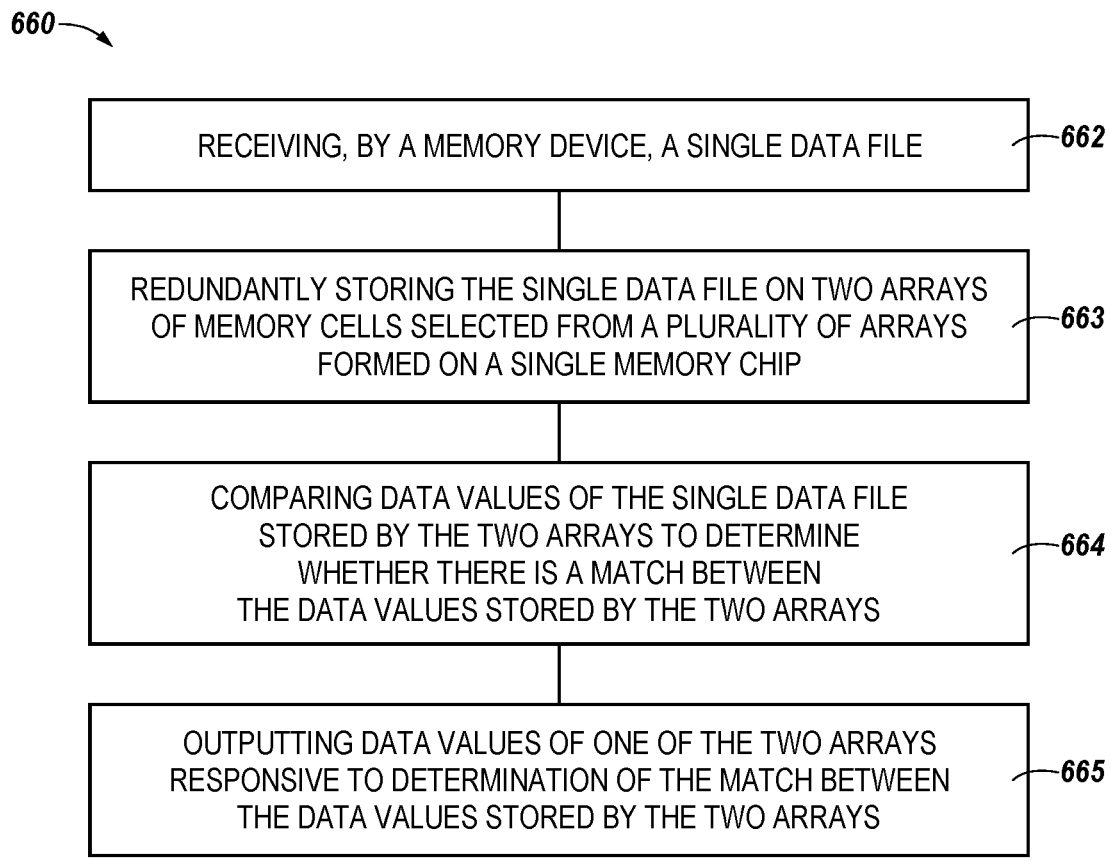
FIG. 6 is a flow chart for determination of a match between data values stored by two arrays in accordance with a number of embodiments of the present disclosure.

FIG. 6 is a flow chart of a method 660 for determination of a match between data values stored by two arrays in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 662, the method 660 may, in a number of embodiments, include receiving, by a memory device (e.g., as shown at 210 and described in connection with FIG. 2), a single data file (e.g., as shown at 102 and described in connection with FIG. 1 and elsewhere herein). At block 663, the method 660 may include redundantly storing the single data file on two arrays of memory cells formed on chip (e.g., as described in connection with FIGS. 1 and 2 and elsewhere herein). At block 664, the method 660 may include comparing data values of the single date file stored by the two arrays to determine whether there is a match between the data values stored by the two arrays (e.g., as described in connection with FIGS. 1 and 3-5 and elsewhere herein). At block 665, the method 660 may include outputting data values of one of the two arrays responsive to determination of the match between the data values stored by the two arrays (e.g., as described in connection with FIGS. 1, 3-5 and elsewhere herein).

In a number of embodiments, the method 660 may include interrupting electrical power supplied to the memory device formed on chip. Interrupting the electrical power may result in disabling a function performed by execution of instructions stored by the single data file on chip based at least in part on interrupting the electrical power. Responsive to the function being disabled, the method 880 may include outputting a notification (e.g., as shown at 335 and described in connection with FIG. 3 and elsewhere herein) of the disabled function to enable a failover functionality stored off chip to perform an alternative function (e.g. in place of the disabled function).

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, particularly with respect to the drawings, reference numbers with hyphenated digits and/or designators such as "X", "Y", "N", "M", etc., (e.g., 213-0, 213-1, 213-2, and 213-N in FIG. 2) indicate that a plurality of the particular feature so designated may be included. It is also to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context. The terms "data" and "data values" are used interchangeably herein and may have the same meaning, as appropriate to the context (e.g., one or more data units or "bits").

While example embodiments including various combinations and configurations of arrays, comparator circuitry, comparator components, output enablers, validation components, output components, functionalities, monitor components, among other circuitry for determination of a match between data values stored by three arrays have been illustrated and described herein, embodiments of the present disclosure are not limited to those combinations explicitly recited herein. Other combinations and configurations of the arrays, comparator circuitry, comparator components, output enablers, validation components, output components, functionalities, monitor components, among other circuitry for determination of a match between data values stored by three arrays disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a plurality of arrays of memory cells formed on a single memory chip;
comparator circuitry configured to compare data values stored by two arrays selected from the plurality to determine whether there is a match between the data values stored by the two arrays based upon an adjustable threshold number of mismatches of data values stored by the two arrays; and
an output component of the comparator circuitry configured to output data values of one of the two arrays responsive to determination of the match between the data values stored by the two arrays.

2. The apparatus of claim 1, wherein the comparator circuitry is configured to compare data values of a single data set stored by the two arrays.

3. The apparatus of claim 1, wherein the two arrays are each formed in a same configuration of memory cells on the single memory chip.

4. The apparatus of claim 1, wherein:
the plurality of arrays of memory cells formed on the single memory chip is formed on an autonomous vehicle; and
the apparatus comprises other memory off the single memory chip, the other memory storing instructions executable for a failover functionality for execution responsive to determination of no match or a mismatch between the data values stored by the two arrays.

5. The apparatus of claim 1, wherein the adjustable threshold number is adjusted to no mismatches.

6. The apparatus of claim 1, further comprising:
two comparator components of the comparator circuitry corresponding to the two arrays selected from the plurality;
an output enabler of the comparator circuitry configured to enable activation of the output component responsive to determination by the output enabler of a match between the data values stored by the two arrays; and
a validation component of the comparator circuitry configured to direct that the data values of the match are output by the activated output component.

7. The apparatus of claim 1, further comprising an output enabler of the comparator circuitry configured to enable output of a notification to a monitor component formed off the single memory chip responsive to determination by the output enabler of no match between the data values stored by the two arrays.

8. The apparatus of claim 1, further comprising:
the output component further configured to:
select between coupling of a first bus to a first array and coupling of a second bus to a second array responsive to determination of a match between the data values stored by the two arrays; and
output the data values corresponding to the match from the one of the two arrays to a functionality formed off the single memory chip.

9. The apparatus of claim 1, further comprising a selection component configured to enable direction of the output component to select a first array as a default option responsive to determination of the match between the first array and a second array of the two arrays.

10. An apparatus, comprising:
a plurality of arrays of memory cells formed on a single memory chip;
comparator circuitry configured to compare data values stored by two arrays selected from the plurality to determine whether there is a match between the data values stored by the two arrays, wherein the comparator circuitry comprises:
two comparator components corresponding to the two arrays selected from the plurality;
an output enabler configured to enable activation of an output component responsive to determination by the output enabler of the match between the data values stored by the two arrays;
a validation component configured to direct that the data values of the match are output by the activated output component; and
the activated output component configured to output data values of one of the two arrays responsive to the determination of the match between the data values stored by the two arrays and the direction by the validation component.

* * * * *